US012381068B2

(12) United States Patent
Yang et al.

(10) Patent No.: US 12,381,068 B2
(45) Date of Patent: *Aug. 5, 2025

(54) RADIO FREQUENCY SCREEN FOR AN ULTRAVIOLET LAMP SYSTEM

(71) Applicant: Taiwan Semiconductor Manufacturing Co., Ltd., Hsin-Chu (TW)

(72) Inventors: Sheng-chun Yang, Tainan (TW); Po-Wei Liang, Luodong Township (TW); Chao-Hung Wan, Taichung (TW); Yi-Ming Lin, Tainan (TW); Liu Che Kang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/667,944

(22) Filed: May 17, 2024

(65) Prior Publication Data

US 2024/0304426 A1  Sep. 12, 2024

Related U.S. Application Data

(63) Continuation of application No. 18/140,986, filed on Apr. 28, 2023, now Pat. No. 12,020,910, which is a continuation of application No. 16/929,881, filed on Jul. 15, 2020, now Pat. No. 11,670,491.

(51) Int. Cl.
*H01J 37/32* (2006.01)

(52) U.S. Cl.
CPC .. *H01J 37/32651* (2013.01); *H01J 37/32082* (2013.01); *H01J 2237/0266* (2013.01)

(58) Field of Classification Search
CPC ........... H01J 37/32651; H01J 37/32082; H01J 2237/0266; H01J 61/103; H01J 65/044; H05B 3/0047; H05B 3/0033
See application file for complete search history.

(56) References Cited

U.S. PATENT DOCUMENTS

| | | | |
|---|---|---|---|
| 6,841,790 B1 * | 1/2005 | Phillips | F26B 3/28 250/493.1 |
| 2008/0186139 A1 * | 8/2008 | Butler | G08B 13/2431 340/10.1 |
| 2008/0186180 A1 * | 8/2008 | Butler | H04L 67/12 340/572.1 |

(Continued)

FOREIGN PATENT DOCUMENTS

| | | |
|---|---|---|
| CN | 201139801 Y | 10/2008 |
| CN | 213566273 U | 6/2021 |
| JP | 2008198861 A * | 8/2008 |

(Continued)

*Primary Examiner* — Abdullah A Riyami
*Assistant Examiner* — Syed M Kaiser
(74) *Attorney, Agent, or Firm* — Harrity & Harrity, LLP

(57) ABSTRACT

A radio frequency (RF) screen for a microwave powered ultraviolet (UV) lamp system is disclosed. In one example, a disclosed RF screen includes: a sheet comprising a conductive material; and a frame around edges of the sheet. The conductive material defines a predetermined mesh pattern of individual openings across substantially an operative area of the screen. Each of the individual openings has a triangular shape.

20 Claims, 17 Drawing Sheets

(56) References Cited

U.S. PATENT DOCUMENTS

2011/0241546 A1* 10/2011 Blandford, III ...... H01J 65/044
 174/385
2016/0321480 A1* 11/2016 Hamlin .................. G16Z 99/00

FOREIGN PATENT DOCUMENTS

| JP | 2015144127 A | 8/2015 |
|---|---|---|
| WO | 2007068002 A2 | 6/2007 |
| WO | 2015172053 A1 | 11/2015 |

\* cited by examiner

RADIO FREQUENCY SCREEN FOR AN ULTRAVIOLET LAMP SYSTEM

CROSS-REFERENCE TO RELATED APPLICATION

This application is a continuation of U.S. patent application Ser. No. 18/140,986, filed Apr. 28, 2023, which is a continuation of U.S. patent application Ser. No. 16/929,881, filed Jul. 15, 2020, which is incorporated by reference herein in their entireties.

BACKGROUND

Ultraviolet (UV) lamp systems may be used in semiconductor manufacturing processes to cure inks, coatings, photoresists, and adhesives in a variety of applications. These applications may include, for instance, decorating, laminating, hard-coat protection, circuit board conformal coatings, photoresist, photolithography, printing, and solar simulation. A UV lamp produces high intensity radiation energy in the UV, visible, and infrared spectrums. This high intensity radiation energy may be used to cure inks, coatings, photoresists, and adhesives that are applied to a variety of substrates, such as paper, plastic film, wood, and metal.

A microwave powered UV lamp system has an irradiator to convert electrical power to radio frequency (RF) energy. The microwave energy or RF energy is guided into a cavity where a UV bulb is positioned to absorb the RF energy and change to a plasma state. The plasma produces radiation energy in the UV lamp system in the form of UV light. The microwave powered UV lamp system has an RF screen with openings to capture and seal the RF energy within the cavity while permitting light energy to be transmitted through the screen openings.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Figure 1:
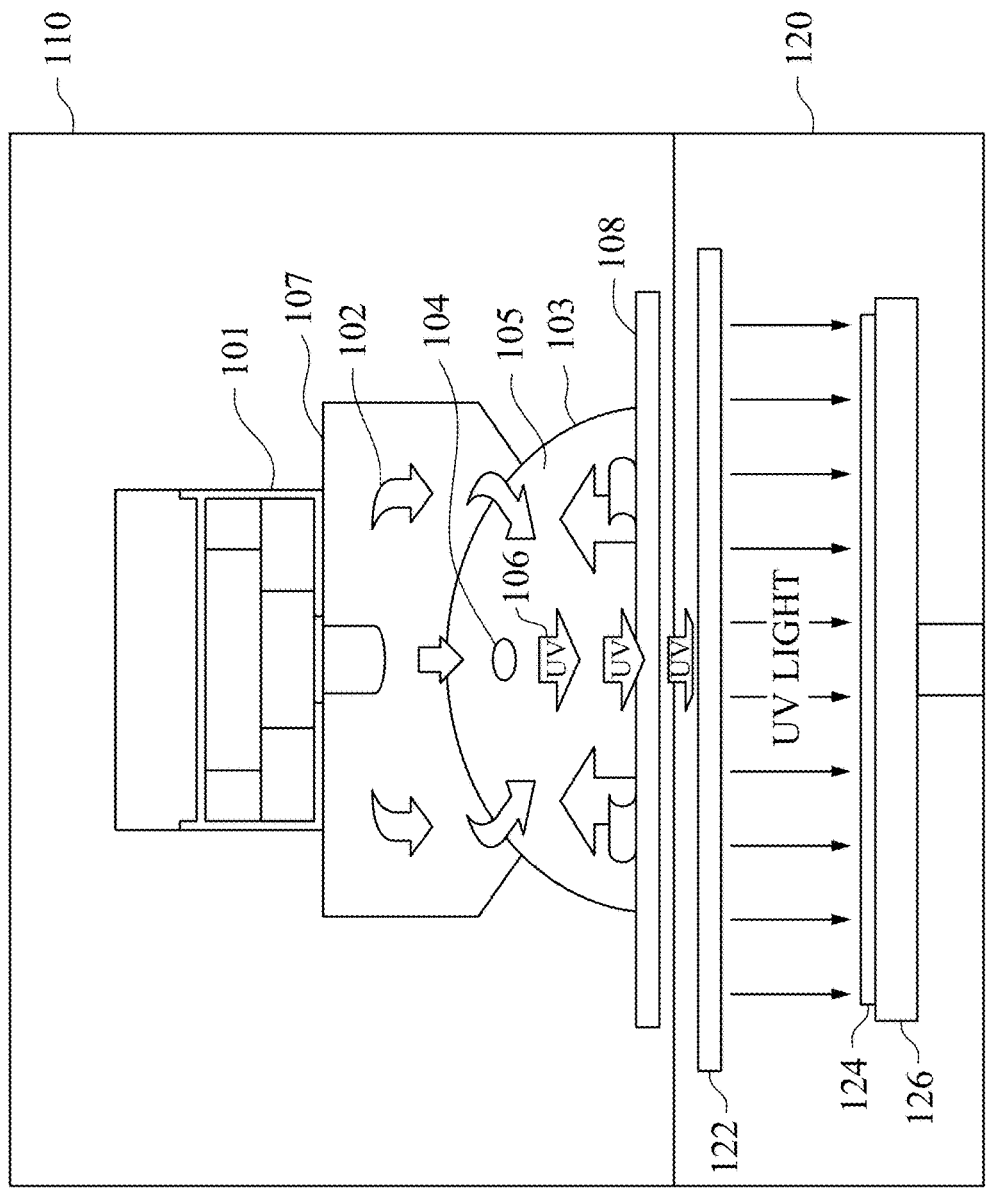
FIG. 1 illustrates a cross sectional view of an exemplary UV lamp system having an RF screen, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides a RF screen in a UV lamp system to provide better reliability and higher light output.

The disclosed RF screen has a mesh pattern of individual openings across substantially an operative area of the screen. According to various embodiments of the present teaching, the screen openings are in the shape of triangles, e.g. isosceles triangles, equilateral triangles, right triangles, and/ or scalene triangles. In one embodiment, the individual openings of the RF screen are in the shape of multiple types of triangles. The triangles in two adjacent rows of the mesh pattern may or may not be aligned to each other. Compared to RF screens with rectangular, square, or hexagonal openings, the disclosed RF screen with triangular openings can sustain a higher stress, have a lower deformation, and thus have a better reliability. In addition, the disclosed RF screen can achieve a better UV light transmittance, i.e. higher UV light output through the RF screen, which improves the efficiency of the UV lamp system and reduces the amount of downtime to the UV lamp system.

FIG. 1 illustrates a cross sectional view of an exemplary UV lamp system 100 having an RF screen 108, in accordance with some embodiments of the present disclosure. In some embodiments, the UV lamp system 100 heats and cures materials, such as a material layer (or film) disposed over a substrate. For simplicity and clarity, FIG. 1 shows only selected portions of an overall UV lamp system to facilitate an understanding of aspects of the present disclosure. Additional features can be added in the UV lamp system 100, and some of the features described below can be replaced or eliminated for other embodiments of the UV lamp system 100.

As shown in FIG. 1, the UV lamp system 100 includes a radiation generator 110. The radiation generator 110 generates radiation that can be used to heat or cure a material layer (film) disposed over a substrate. In one embodiment, the radiation generator 110 is a UV lamp module. The radiation generator 110 may include dynamic portions configured to move, for example, in a swinging motion, a rotating motion, other suitable motion, or combinations thereof.

The radiation generator 110 in this example further includes an energy source 101. The energy source 101 can generate energy to excite a radiation of UV light. For example, the energy source 101 may include one or more microwave generators, such as magnetrons, that generate microwave energy, e.g. radio frequency (RF) microwave energy 102, that can excite a radiation of UV light. The energy source 101 may include one or more transformers to energize filaments of the magnetron. The energy source 101 may be coupled to a power supply that provides electrical power to the energy source 101. The magnetrons in the energy source 101 can convert the electrical power received from the power supply to microwave energy or RF energy.

The radiation generator 110 in this example further includes a radiation source 103 coupled with the energy source 101. The energy source 101 may be coupled to the radiation source 103 via a waveguide 107, which directs energy produced by the energy source 101, such as microwave energy, to the radiation source 103. In one embodiment, the radiation source 103 is a UV radiation lamp that includes a UV lamp source 104 disposed within a cavity or chamber 105, such as a microwave chamber. The chamber 105 may have an oxygen-free atmosphere to ensure that radiation generated by the radiation source 103, such as UV radiation, is not absorbed by the chamber environment. The chamber 105 may be a vacuum chamber with a suitable temperature maintained within the chamber 105.

The UV lamp source 104 housed within the radiation source 103 may include one or more UV bulbs. In one example, each UV bulb is a sealed plasma bulb filled with one or more gases, such as xenon (Xe), mercury (Hg), krypton (Kr), argon (Ar), other suitable gas, or combinations thereof. The gases used within the UV lamp source 104 may absorb the microwave (RF) energy and, consequently, change to a plasma state. The plasma may produce radiation energy in the UV lamp system 100 in the form of UV light. In one embodiment, the gases used within the UV lamp source 104 can be selected such that selected UV radiation wavelengths are emitted from the radiation source 103. In one embodiment, the selected UV radiation wavelengths are between 200 and 450 nm. As such, energy produced by the energy source 101, such as microwave energy, is directed by the waveguide 107 to the radiation source 103 to excite elements of the radiation source 103, such as the gases of the UV lamp source 104, so that the radiation source 103 emits UV radiation 106. To be specific, each UV bulb of the UV lamp source 104 can be excited by the RF energy 102 to emit UV light 106.

The radiation generator 110 in this example further includes an RF screen 108 attached to the radiation source 103 to encapsulate the cavity 105. The RF screen 108 may include a sheet made of a conductive material with a predetermined mesh pattern of individual openings. The RF screen 108 prevents or blocks the RF energy from escaping and travelling out of the cavity 105, while permitting UV light 106 to be transmitted through the screen openings. In one embodiment, the openings in the RF screen 108 are constructed to be smaller than the RF radiation wavelength. In one embodiment, the RF energy has a frequency range of about 2445~2470 MHz.

The radiation generator 110 is coupled to a process portion 120. The radiation generator 110 and the process portion 120 may collectively be referred to as a radiation process chamber, or a UV process chamber. The process portion 120 includes a wafer holder 126. The wafer holder 126 includes a pedestal for supporting a substrate, such as a substrate 124. The substrate 124 may alternatively be referred to as a material layer, or the substrate 124 may include a material layer disposed thereon that will be exposed to the UV radiation 106 from the radiation source 103. The material layer may be a metal layer, a semiconductor layer, or a dielectric layer. The wafer holder 126 may include a heating mechanism for heating the substrate 124. In an example, a position of the substrate 124 within the process portion 120 is adjusted by a mechanism of the wafer holder 126 that allows the wafer holder 126 to move within the process portion 120. For example, the wafer holder 126 may move vertically, horizontally, or both to position the substrate 124 at a particular distance from the radiation source 103. Radiation, such as UV light 106, emitted from the radiation source 103 enters the process portion 120 by passing through a window 122 and exposes the substrate 124. The window 122 is thick enough to maintain vacuum. The window 122 may further include a material, such as quartz, that transmits the radiation 106.

In one embodiment, the UV lamp system 100 further includes a radiation sensor to detect and convert radiation 106 emitted by the radiation source 103 into electronic signals that indicate characteristics of the detected radiation 106, such as an intensity of the detected radiation 106, a temperature within the cavity 105, and/or a temperature of the substrate 124. Once a characteristic value is above or below a predetermined threshold, the UV lamp system 100 will adjust some control parameters, e.g. by a blower fan, to modify the characteristic value back to normal.

Figure 2:
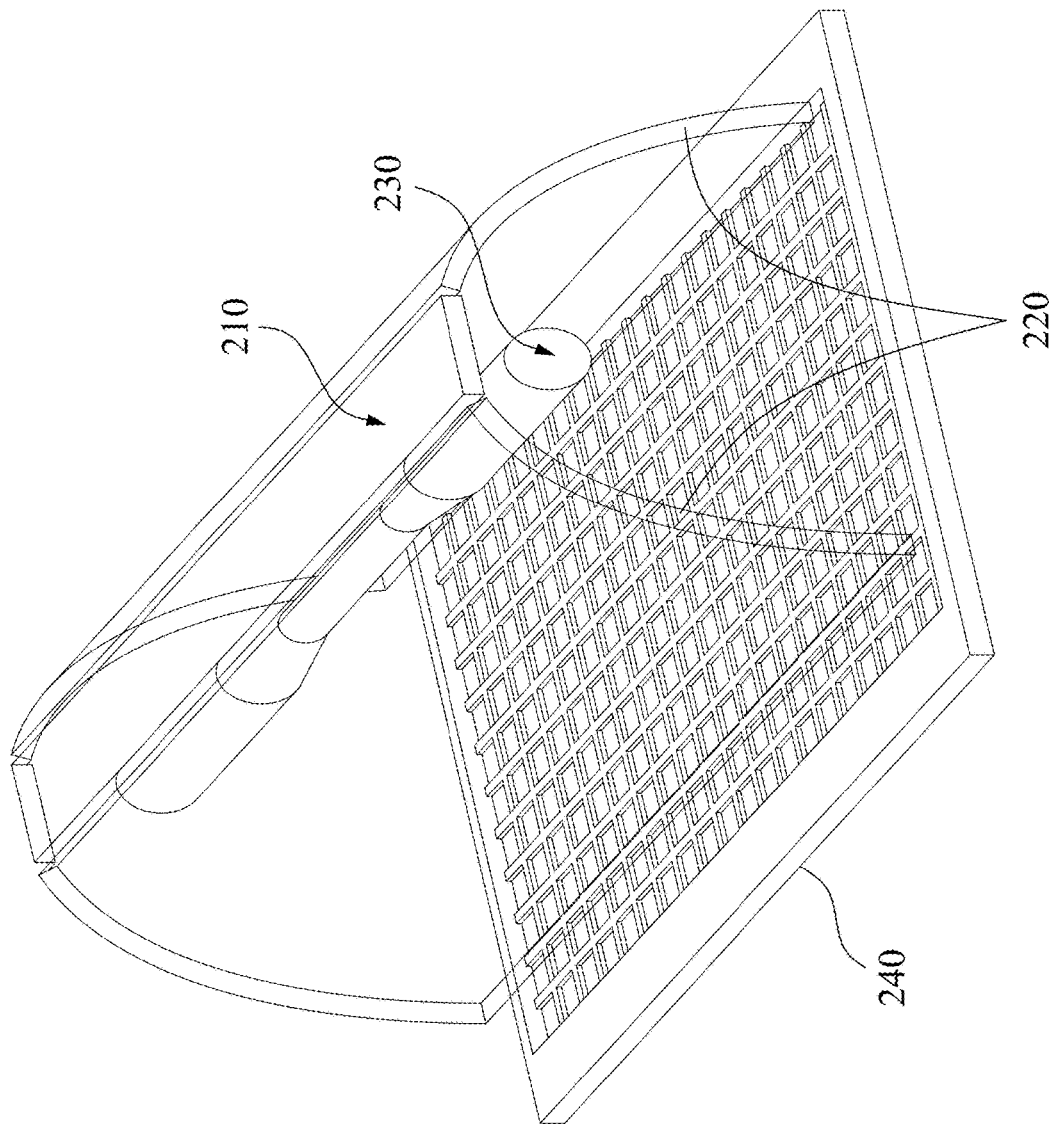
FIG. 2 illustrates a perspective view of an exemplary RF screen attached to a reflector, in accordance with some embodiments of the present disclosure.

FIG. 2 illustrates a perspective view 200 of an exemplary RF screen attached to a reflector in a UV lamp system, e.g.

the UV lamp system 100 in FIG. 1, in accordance with some embodiments of the present disclosure. As shown in FIG. 2, a reflector may include a top portion 210 and two curved reflecting surfaces 220. The reflector is coupled to a RF screen 240. A cavity is formed by the RF screen 240, the top portion 210, and curved reflecting surfaces 220 of the reflector. A UV bulb 230 is located within the cavity to emit UV light when excited by RF energy. The reflector properly focus the UV light energy emitted from the UV bulb 230 contained within the reflector, except allowing the UV light energy to transmit through the RF screen 240.

In one embodiment, the UV bulb 230 is made of glass; the reflector is made of glass or quartz. The RF screen 240 may be made of a conductive material, e.g. copper, brass, stainless steel, tungsten, aluminum, or other metals or metal alloys.

Figure 3:
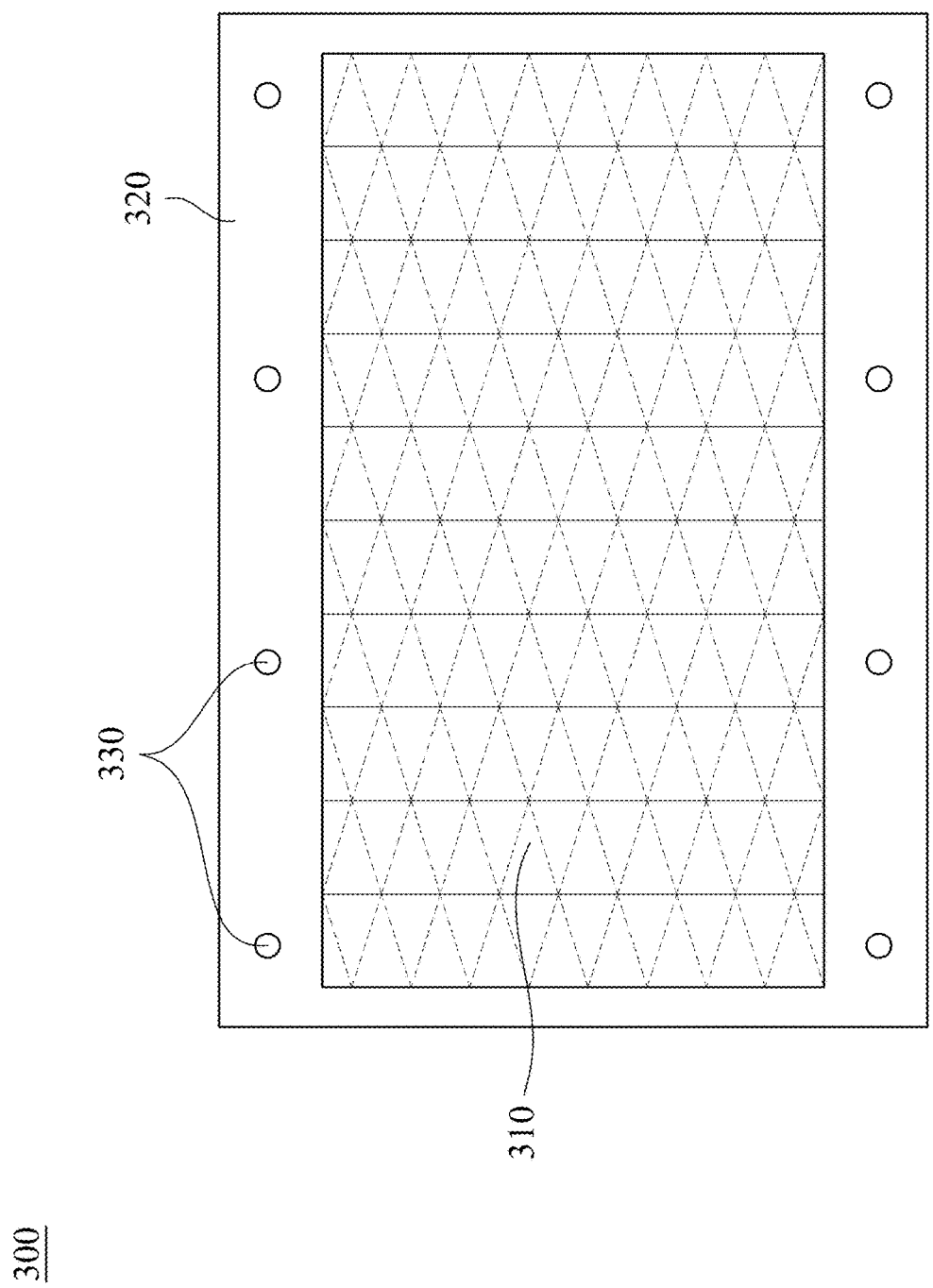
FIG. 3 illustrates a top view of an exemplary RF screen, in accordance with some embodiments of the present disclosure.

FIG. 3 illustrates a top view of an exemplary RF screen 300, in accordance with some embodiments of the present disclosure. As shown in FIG. 3, the RF screen 300 includes a sheet 310 and a frame 320 around edges of the sheet 310. The sheet 310 may include a conductive material comprising copper, brass, stainless steel, tungsten, aluminum, nickel, silver, or combinations thereof.

In this example, the sheet 310 has a rectangular shape with four edges, and has a predetermined mesh pattern of individual openings across substantially an operative area of the RF screen 300. As shown in FIG. 3, the predetermined mesh pattern tiles the rectangular surface of the sheet 310 with a plurality of triangles. Tiling of a surface means filling up the surface using one or more geometric shapes, with no overlaps and no gaps. Each of the individual openings has a triangular shape. The frame 320 is equipped with holes 330 that are utilized for attachment of the RF screen 300 to a UV lamp system. In one embodiment, the predetermined mesh pattern comprises 16 to 36 individual openings in a unit area of 1 square centimeter. In one embodiment, the RF screen 300 has a thickness between 0.001 inch and 0.015 inch.

Compared to a reference screen with a mesh pattern comprising individual openings in the shape of a square, a rectangle, or a hexagon, the disclosed RF screen 300 with triangular openings can yield an increase in UV light transmittance, a decrease in maximum deformation, and a decrease in maximum stress, when the disclosed RF screen 300 and the reference screen have a same number of individual openings in a unit area. That is, a RF screen with triangular openings is less likely to be damaged or deformed, and can provide a higher UV light output through the screen, compared to RF screens with openings in the shapes of square, rectangle, and hexagon.

Figure 4:
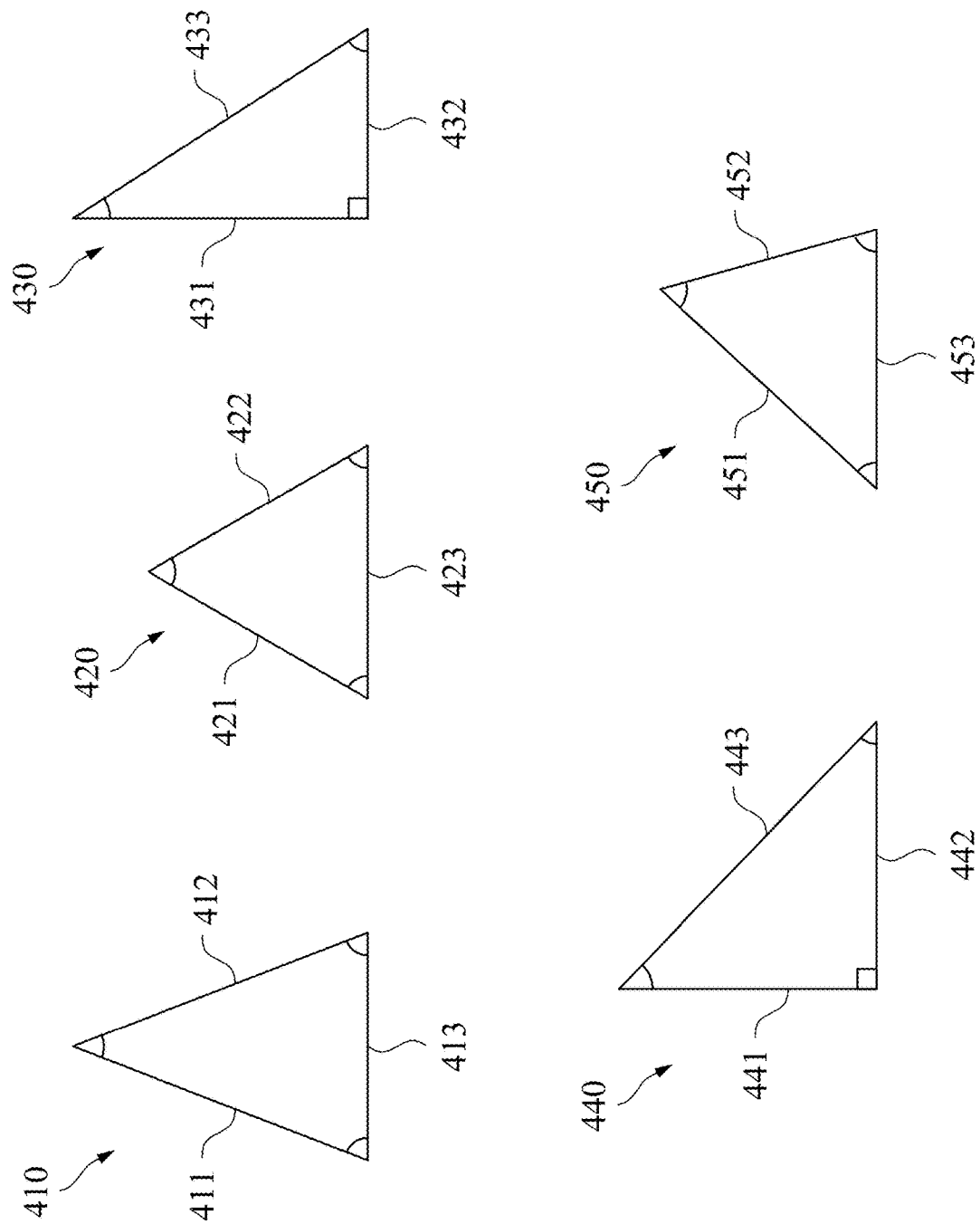
FIG. 4 illustrates exemplary shapes of RF screen openings, in accordance with some embodiments of the present disclosure.

FIG. 4 illustrates exemplary shapes of RF screen openings, in accordance with some embodiments of the present disclosure. While a RF screen has a mesh pattern of individual openings, at least one of the individual openings has a triangular shape. In one embodiment, each of the individual openings has a triangular shape.

There are different types of triangles, e.g. an isosceles triangle 410, an equilateral triangle 420, a right triangle 430, an isosceles right triangle 440, and a scalene triangle 450. An isosceles triangle is a triangle that has two sides of equal length. The two equal sides are called the legs and the third side is called the base of the triangle. As such, the isosceles triangle 410 has two legs 411, 412, and a base 413. An equilateral triangle is a triangle in which all three sides are equal. As shown in FIG. 4, the equilateral triangle 420 has three equal sides 421, 422, 423. The equilateral triangle 420 can be treated as a special isosceles triangle, with any two sides being legs and the third side being a base. A right triangle is a triangle in which one angle is a right angle, i.e. a 90-degree angle. The side opposite the right angle is called the hypotenuse. The sides adjacent to the right angle are called legs. As such, the right triangle 430 has two legs 431, 432, and a hypotenuse 433. An isosceles right triangle is both an isosceles triangle and a right triangle. As shown in FIG. 4, the isosceles right triangle 440 has two equal legs 441, 442 adjacent to the right angle, and a base or hypotenuse 443 opposite the right angle. A scalene triangle is a triangle in which all three sides have different lengths. The angles of a scalene triangle have different measures. As shown in FIG. 4, the three sides 451, 452, 453 of the scalene triangle 450 have different lengths from each other.

In one embodiment, the individual openings of an RF screen are in the shape of a uniform type of triangle. In one embodiment, the individual openings of an RF screen are in the shapes of multiple types of triangles comprising at least one of: an isosceles triangle, a right triangle, an equilateral triangle, or a scalene triangle.

In one embodiment, the mesh pattern tiles a surface of the RF screen with multiple geometric shapes including triangle. For example, for a RF screen having a sheet with a rectangular surface with four edges, the mesh pattern may tile the rectangular surface with a plurality of triangles in proximity of the four edges and a plurality of rectangles or squares surrounded by the plurality of triangles.

FIGS. 5-8 illustrate exemplary mesh patterns of RF screen openings in the shape of isosceles right triangles, in accordance with some embodiments of the present disclosure. In each case, the mesh pattern can tile a rectangular surface of a RF screen with some periodic shapes. That is, the rectangular surface can be tiled without overlaps or gaps by repeating the periodic shape via translation only, without a need of rotating, reflecting or scaling the periodic shape. A translation is a geometric transformation that moves every point of a figure or a shape by the same distance in a given direction. In one embodiment, the periodic shape includes a plurality of isosceles right triangles arranged in a certain pattern, called a repeating pattern. As such, the tiling of each rectangular surface shown in FIGS. 5-8 is a periodic tiling having a repeating pattern.

Figure 5:
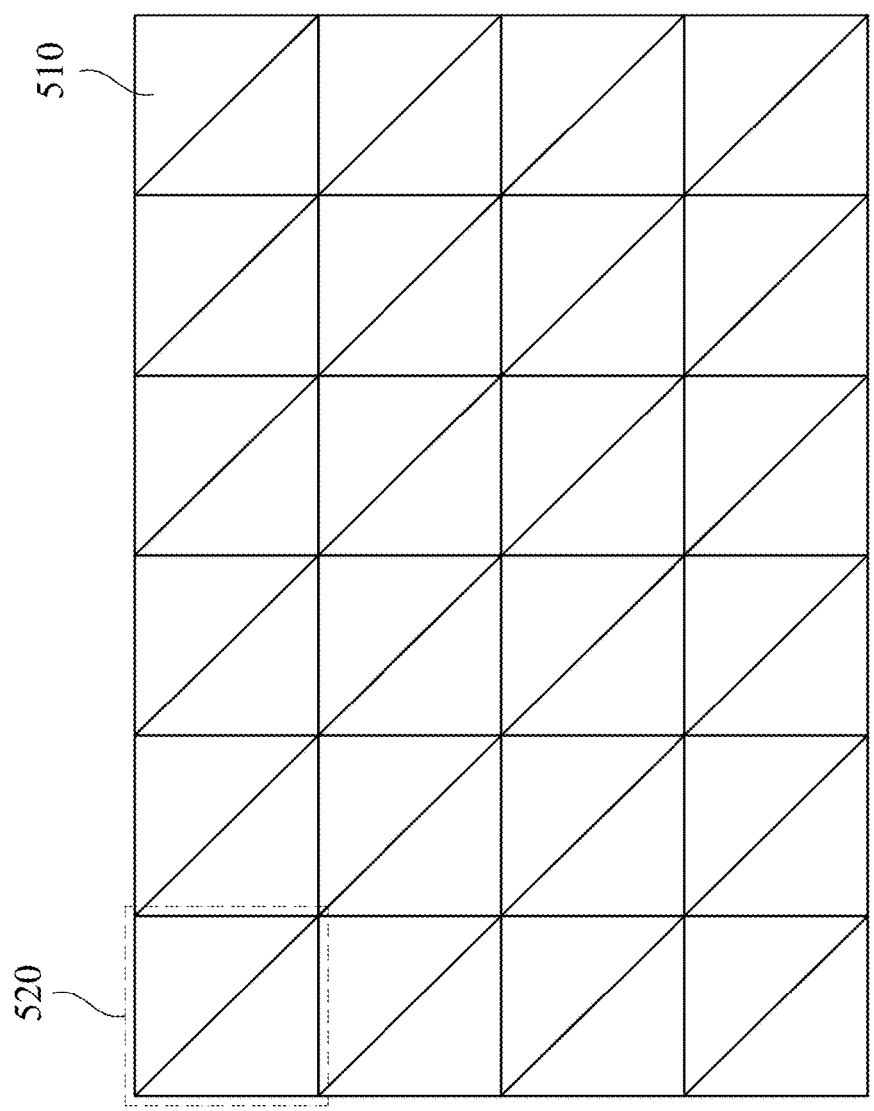
FIGS. 5-8 illustrate exemplary mesh patterns of RF screen openings in the shape of isosceles right triangles, in accordance with some embodiments of the present disclosure.

FIG. 5 illustrates a mesh pattern 500 that can tile a rectangular surface of a RF screen with a plurality of individual openings 510 each of which is in the shape of an isosceles right triangle. The tiling by the mesh pattern 500 is a periodic tiling having a repeating pattern 520. As shown in FIG. 5, the repeating pattern 520 is a square including two isosceles right triangles that are side by side via a same base, which is a diagonal line of the square. The repeating pattern 520 is a minimum pattern element that can be repeated to tile the rectangular surface based merely on translation of the repeating pattern, without a need of rotating, reflecting or scaling the repeating pattern. As such, the mesh pattern 500 can tile the rectangular surface with periodic squares each of which is formed by two isosceles right triangles.

Figure 6:
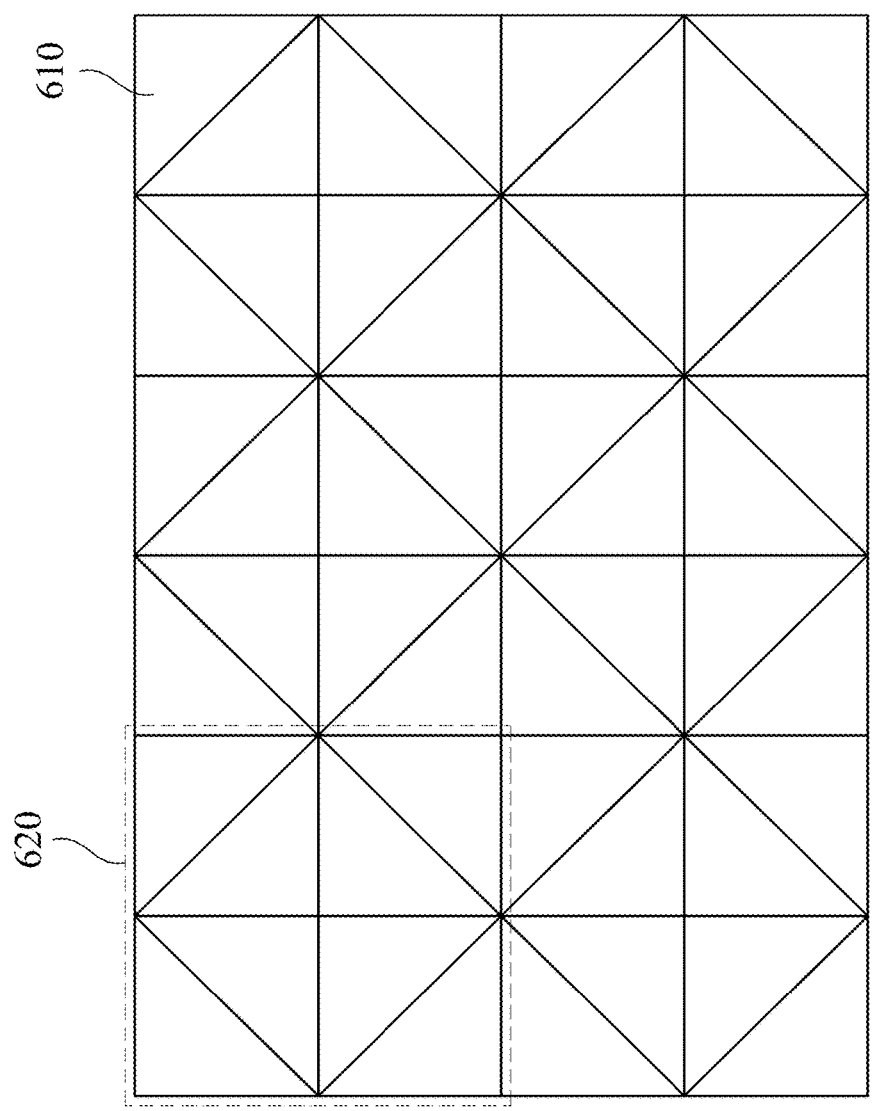

FIG. 6 illustrates a mesh pattern 600 that can tile a rectangular surface of a RF screen with a plurality of individual openings 610 each of which is in the shape of an isosceles right triangle. The tiling by the mesh pattern 600 is a periodic tiling having a repeating pattern 620. As shown in FIG. 6, the repeating pattern 620 is a square including 8 isosceles right triangles. The 8 isosceles right triangles form 4 pairs each of which includes two isosceles right triangles that are side by side via a same base. The repeating pattern 620 is a minimum pattern element that can be repeated to tile the rectangular surface based merely on translation of the repeating pattern, without a need of rotating, reflecting or scaling the repeating pattern. As such, the mesh pattern 600 can tile the rectangular surface with periodic squares each of which is formed by 8 isosceles right triangles.

Figure 7:
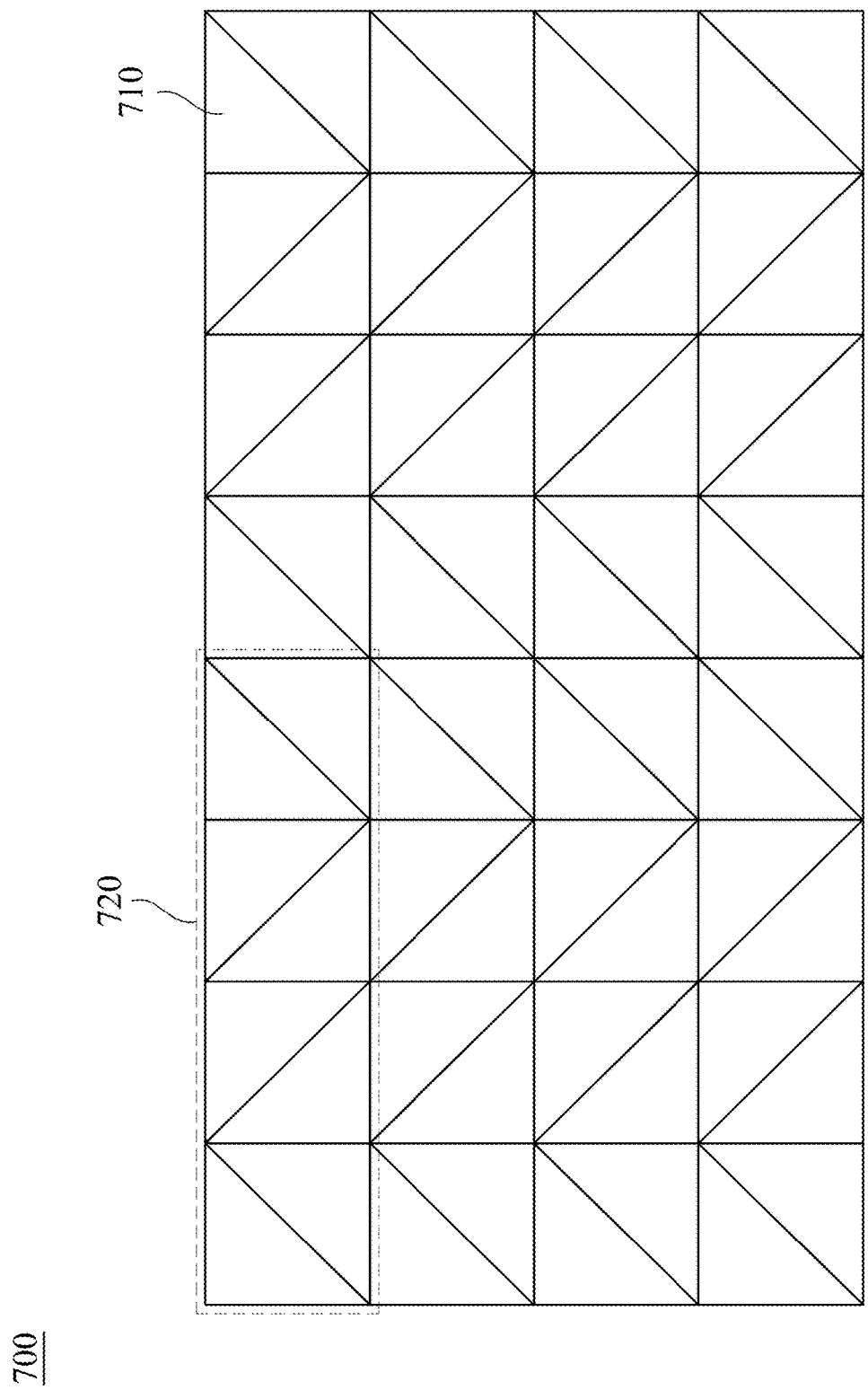

FIG. 7 illustrates a mesh pattern 700 that can tile a rectangular surface of a RF screen with a plurality of individual openings 710 each of which is in the shape of an isosceles right triangle. The tiling by the mesh pattern 700 is a periodic tiling having a repeating pattern 720. As shown in FIG. 7, the repeating pattern 720 is a rectangle including 8 isosceles right triangles. The 8 isosceles right triangles form 4 pairs each of which includes two isosceles right triangles that are side by side via a same base. The repeating pattern 720 is a minimum pattern element that can be repeated to tile the rectangular surface based merely on translation of the repeating pattern, without a need of rotating, reflecting or scaling the repeating pattern. As such, the mesh pattern 700 can tile the rectangular surface with periodic rectangles each of which is formed by 8 isosceles right triangles.

Figure 8:
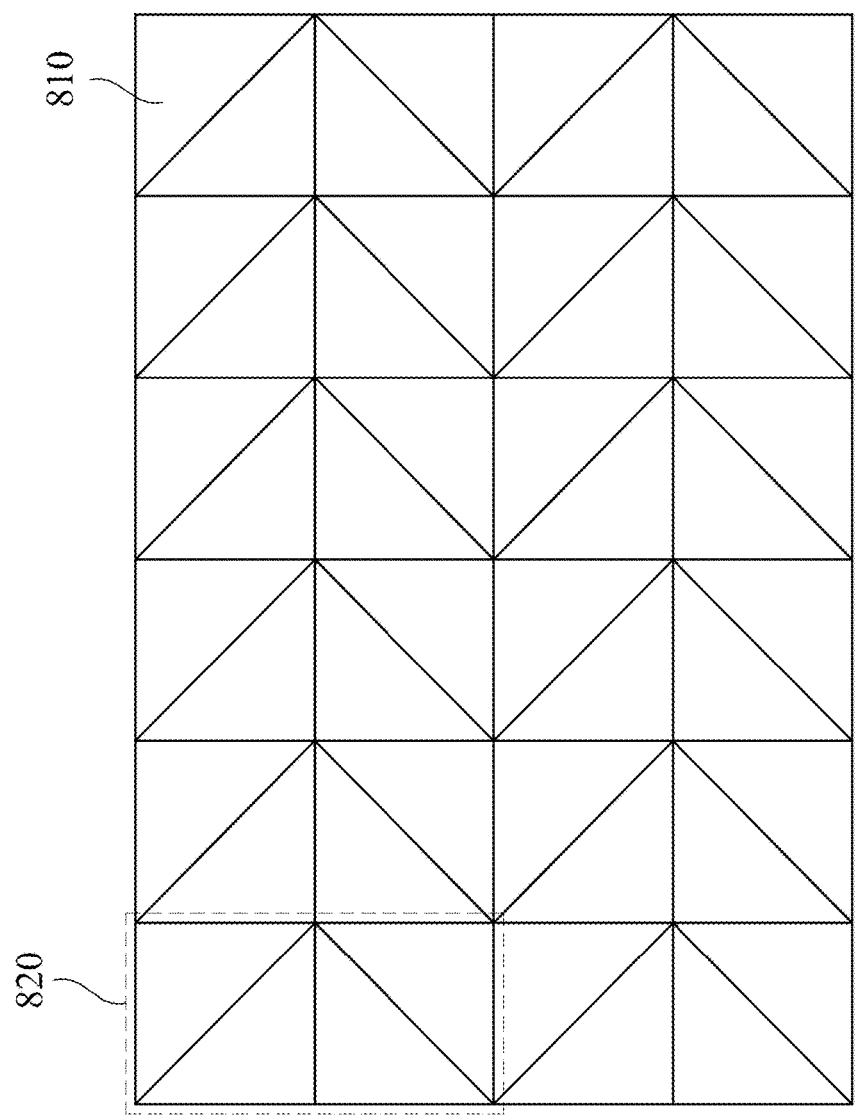

FIG. 8 illustrates a mesh pattern 800 that can tile a rectangular surface of a RF screen with a plurality of individual openings 810 each of which is in the shape of an isosceles right triangle. The tiling by the mesh pattern 800 is a periodic tiling having a repeating pattern 820. As shown in FIG. 8, the repeating pattern 820 is a rectangle including 4 isosceles right triangles. The 4 isosceles right triangles form 2 pairs each of which includes two isosceles right triangles that are side by side via a same base. The repeating pattern 820 is a minimum pattern element that can be repeated to tile the rectangular surface based merely on translation of the repeating pattern, without a need of rotating, reflecting or scaling the repeating pattern. As such, the mesh pattern 800 can tile the rectangular surface with periodic rectangles each of which is formed by 4 isosceles right triangles.

Figure 9:
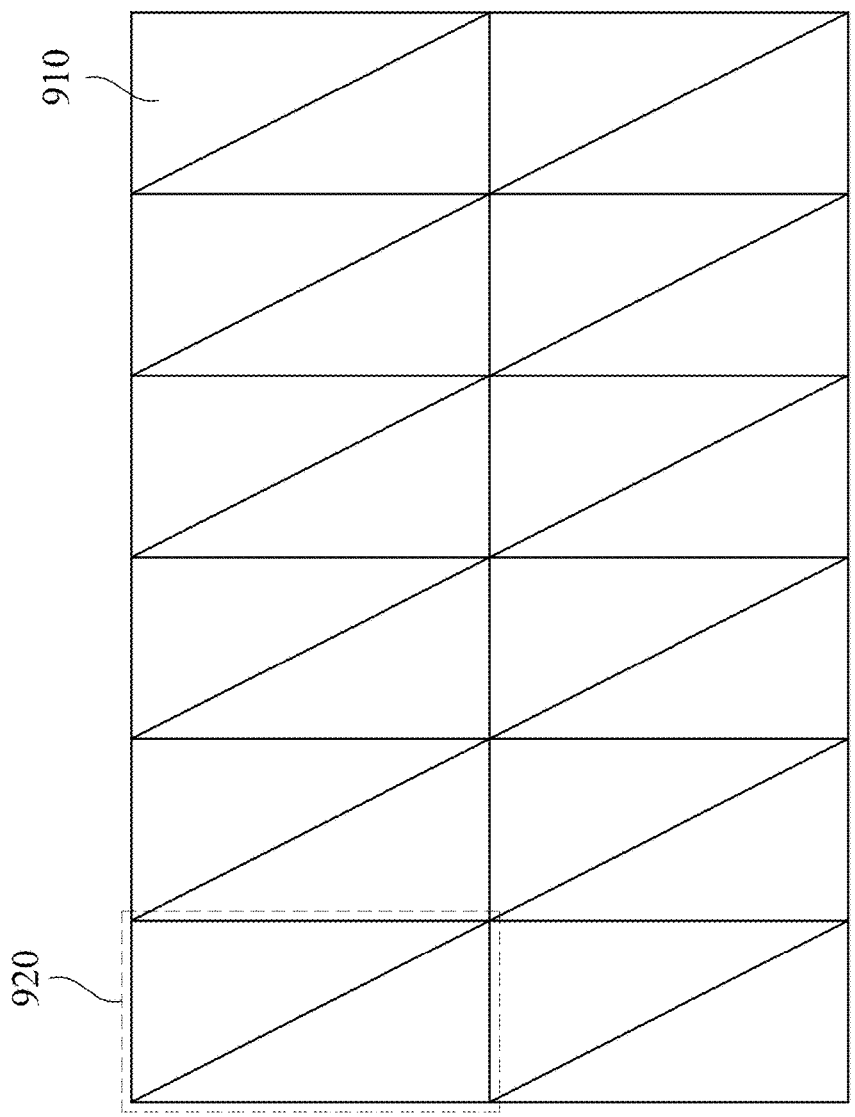
FIGS. 9-12 illustrate exemplary mesh patterns of RF screen openings in the shape of right triangles, in accordance with some embodiments of the present disclosure.

FIG. 9 illustrates a mesh pattern 900 that can tile a rectangular surface of a RF screen with a plurality of individual openings 910 each of which is in the shape of a right triangle. Similar to the mesh pattern 500 in FIG. 5, the tiling by the mesh pattern 900 in FIG. 9 is a periodic tiling having a repeating pattern 920. The repeating pattern 920 is a rectangle including two right triangles that are side by side via a same hypotenuse, which is a diagonal line of the rectangle. That is, the mesh pattern 900 can tile the rectangular surface with periodic rectangles each of which is formed by two right triangles.

Figure 10:
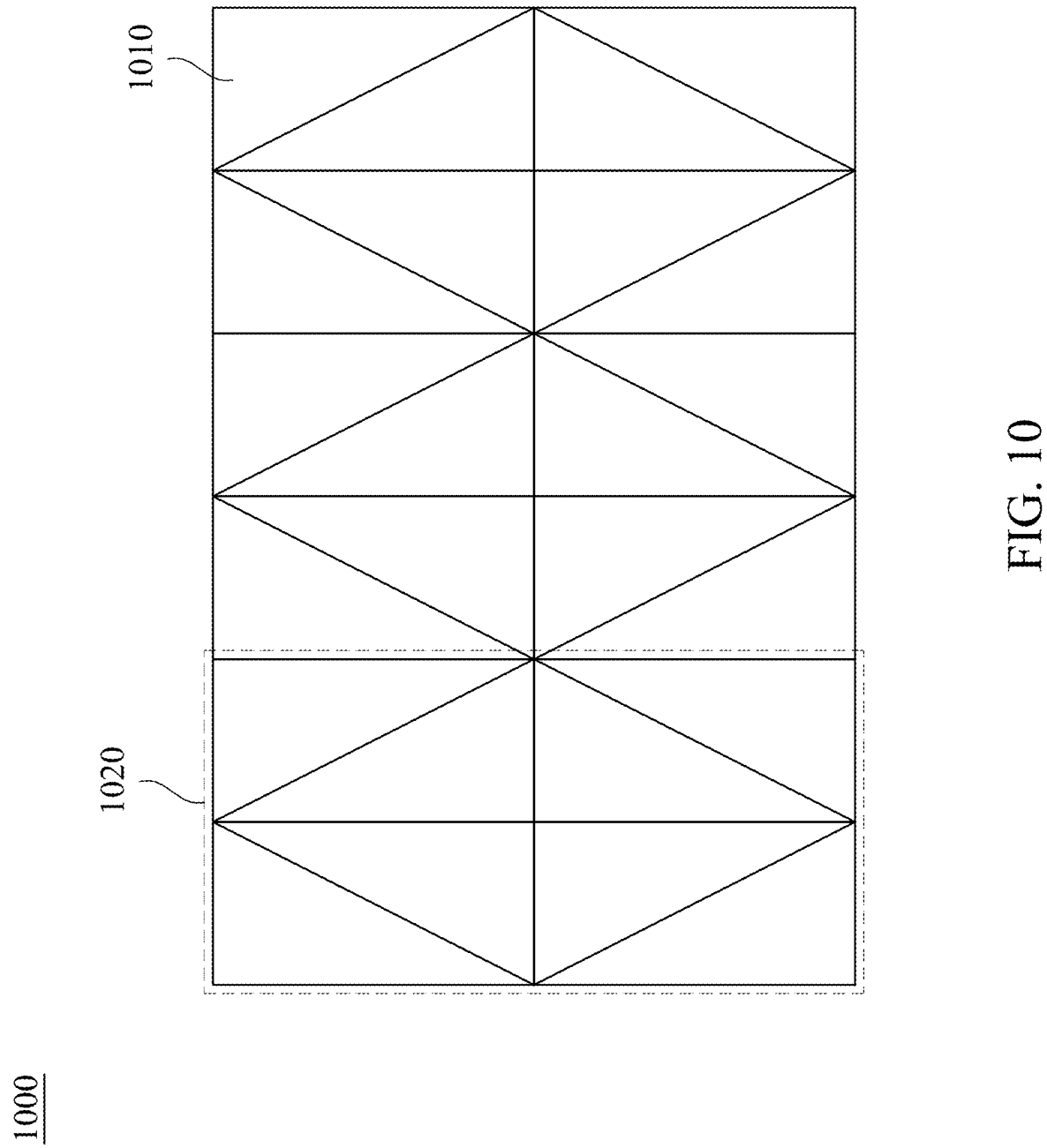

FIG. 10 illustrates a mesh pattern 1000 that can tile a rectangular surface of a RF screen with a plurality of individual openings 1010 each of which is in the shape of a right triangle. Similar to the mesh pattern 600 in FIG. 6, the tiling by the mesh pattern 1000 is a periodic tiling having a repeating pattern 1020, which is a rectangle including 8 right triangles. The 8 right triangles form 4 pairs each of which includes two right triangles that are side by side via a same hypotenuse. That is, the mesh pattern 1000 can tile the rectangular surface with periodic rectangles each of which is formed by 8 right triangles.

Figure 11:
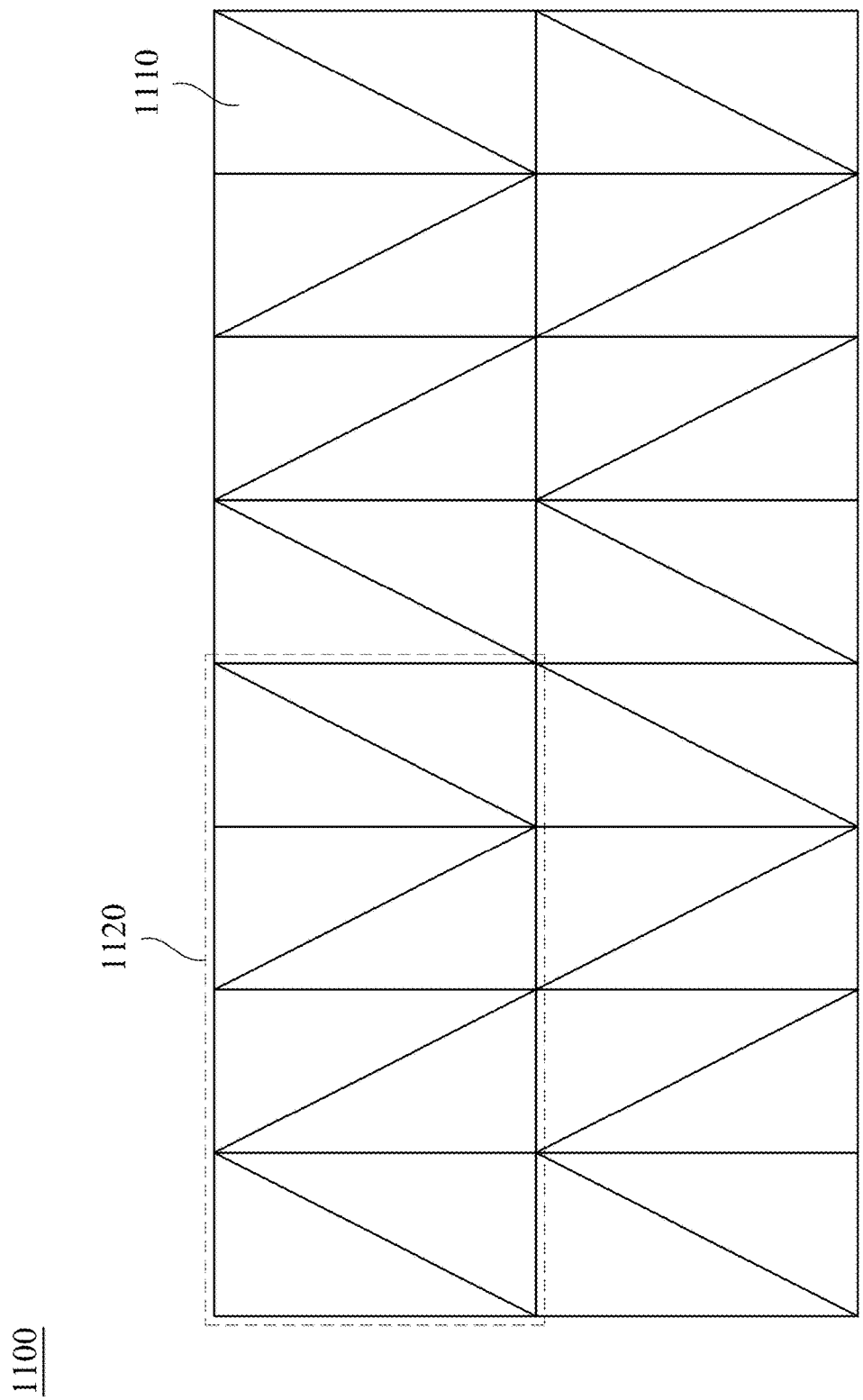

FIG. 11 illustrates a mesh pattern 1100 that can tile a rectangular surface of a RF screen with a plurality of individual openings 1110 each of which is in the shape of a right triangle. Similar to the mesh pattern 700 in FIG. 7, the tiling by the mesh pattern 1100 is a periodic tiling having a repeating pattern 1120, which is a rectangle including 8 right triangles. The 8 right triangles form 4 pairs each of which includes two right triangles that are side by side via a same hypotenuse. That is, the mesh pattern 1100 can tile the rectangular surface with periodic rectangles each of which is formed by 8 right triangles.

Figure 12:
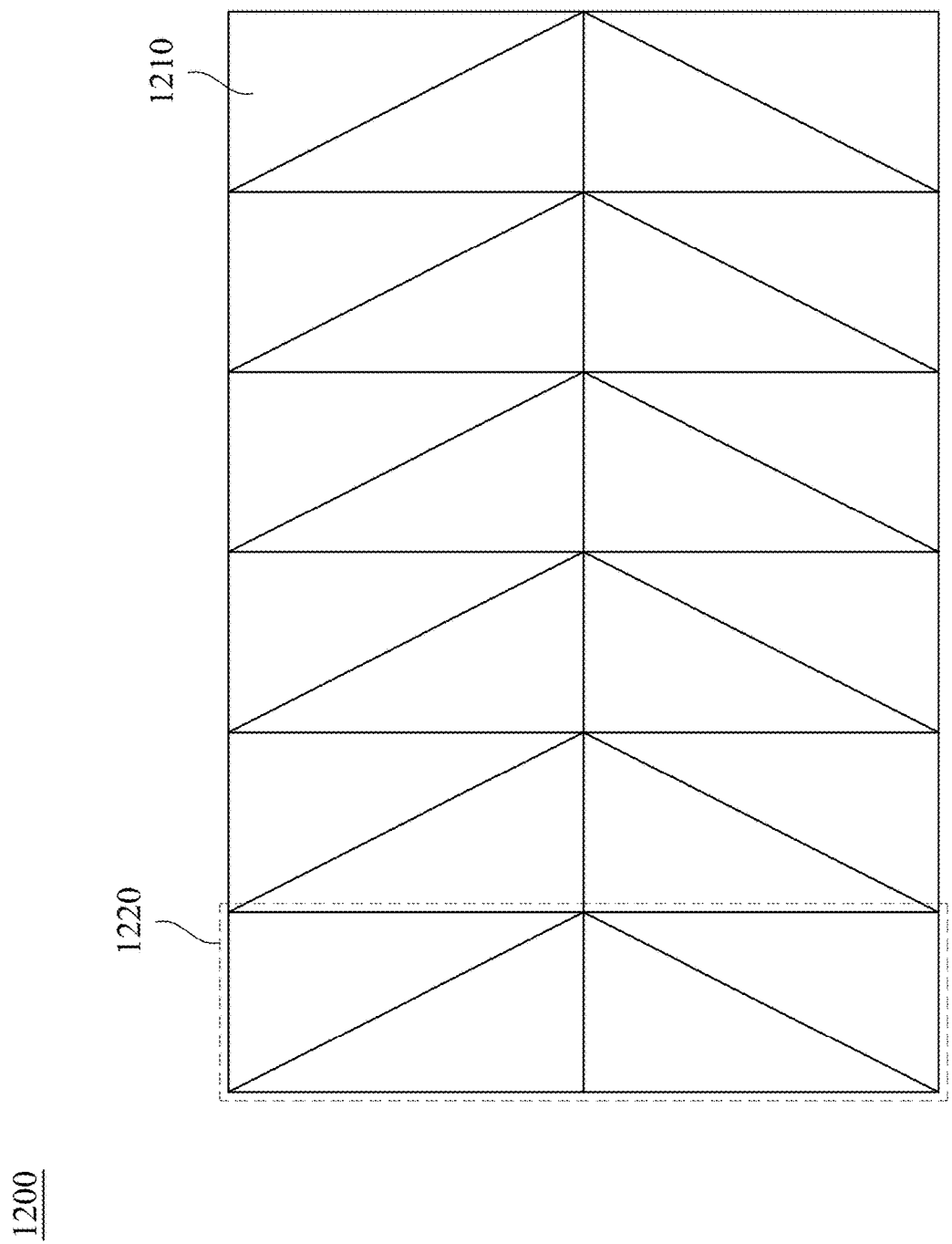

FIG. 12 illustrates a mesh pattern 1200 that can tile a rectangular surface of a RF screen with a plurality of individual openings 1210 each of which is in the shape of a right triangle. Similar to the mesh pattern 800 in FIG. 8, the tiling by the mesh pattern 1200 is a periodic tiling having a repeating pattern 1220, which is a rectangle including 4 right triangles. The 4 right triangles form 2 pairs each of which includes two right triangles that are side by side via a same hypotenuse. That is, the mesh pattern 1200 can tile the rectangular surface with periodic rectangles each of which is formed by 4 right triangles.

Figure 13:
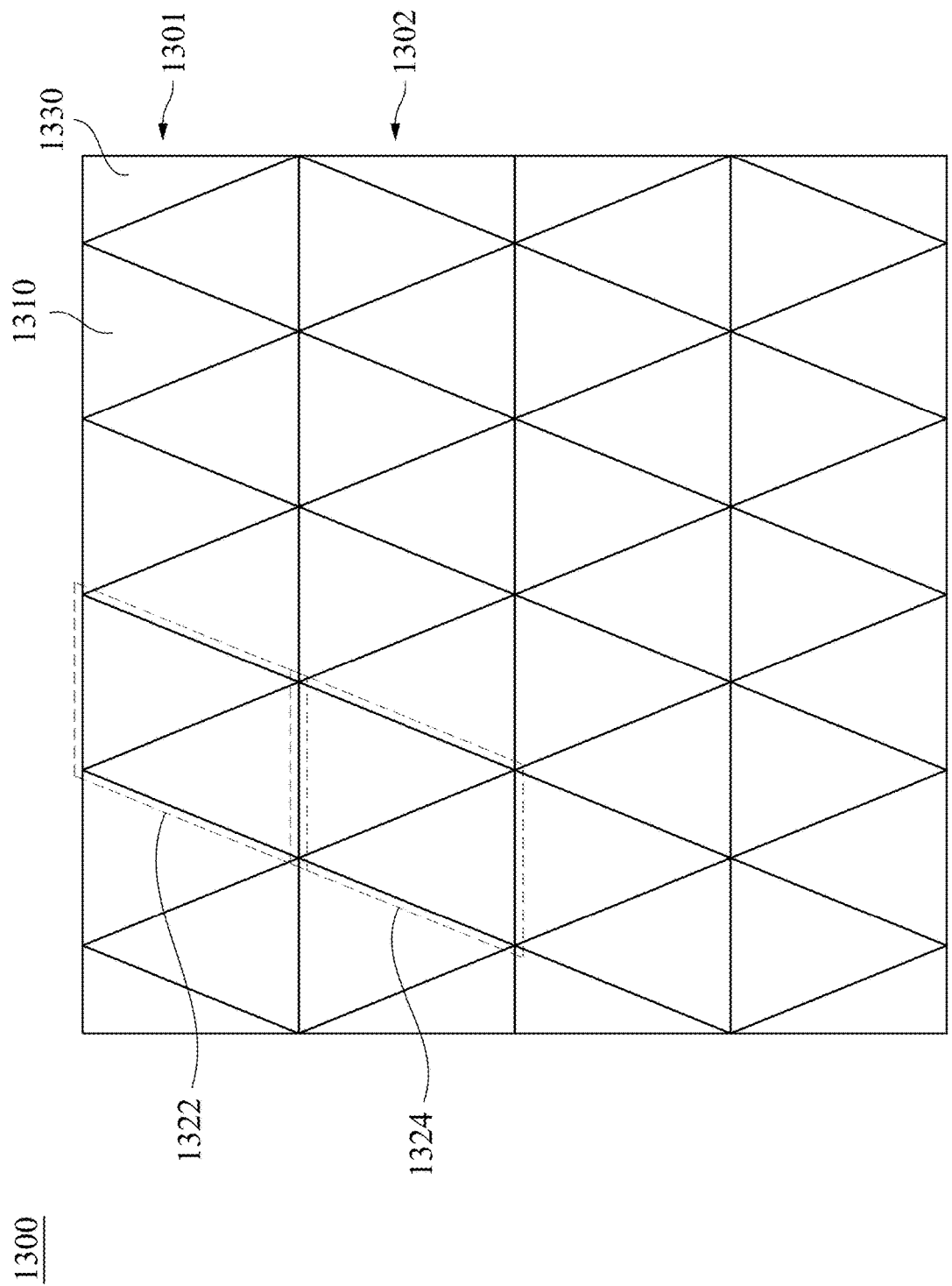
FIGS. 13-14 illustrate exemplary mesh patterns of RF screen openings in the shape of isosceles triangles, in accordance with some embodiments of the present disclosure.

FIG. 13 illustrates a mesh pattern 1300 that can tile a surface of a RF screen with a plurality of individual openings 1310 each of which is in the shape of an isosceles triangle. The tiling by the mesh pattern 1300 is a periodic tiling having a repeating pattern 1322. As shown in FIG. 13, the repeating pattern 1322 is a parallelogram including two isosceles triangles that are side by side via a shared leg, which is a diagonal line of the parallelogram. The repeating pattern 1322 is a minimum pattern element that can be repeated to tile the surface based merely on translation of the repeating pattern, without a need of rotating, reflecting or scaling the repeating pattern. As such, the mesh pattern 1300 can tile the surface with periodic parallelograms each of which is formed by two isosceles triangles.

As shown in FIG. 13, the mesh pattern 1300 comprises a plurality of rows each of which is formed by periodic cells or periodic parallelograms. In this embodiment, the periodic cells in two adjacent rows are aligned to each other. For example, the mesh pattern 1300 includes a first row 1301 formed by periodic parallelograms; and includes a second row 1302 formed by periodic parallelograms. The first row 1301 and the second row 1302 are adjacent to each other. The periodic parallelograms of the first row 1301 and the periodic parallelograms of the second row 1302 are aligned to each other, which means they share common sides. For example, the periodic parallelogram 1322 of the first row 1301 and the periodic parallelogram 1324 of the second row 1302 are side by side via a shared common side. When the RF screen surface is in the shape of a rectangle as shown in FIG. 13, each row has two right triangles 1330 at the two ends of the row.

Figure 14:
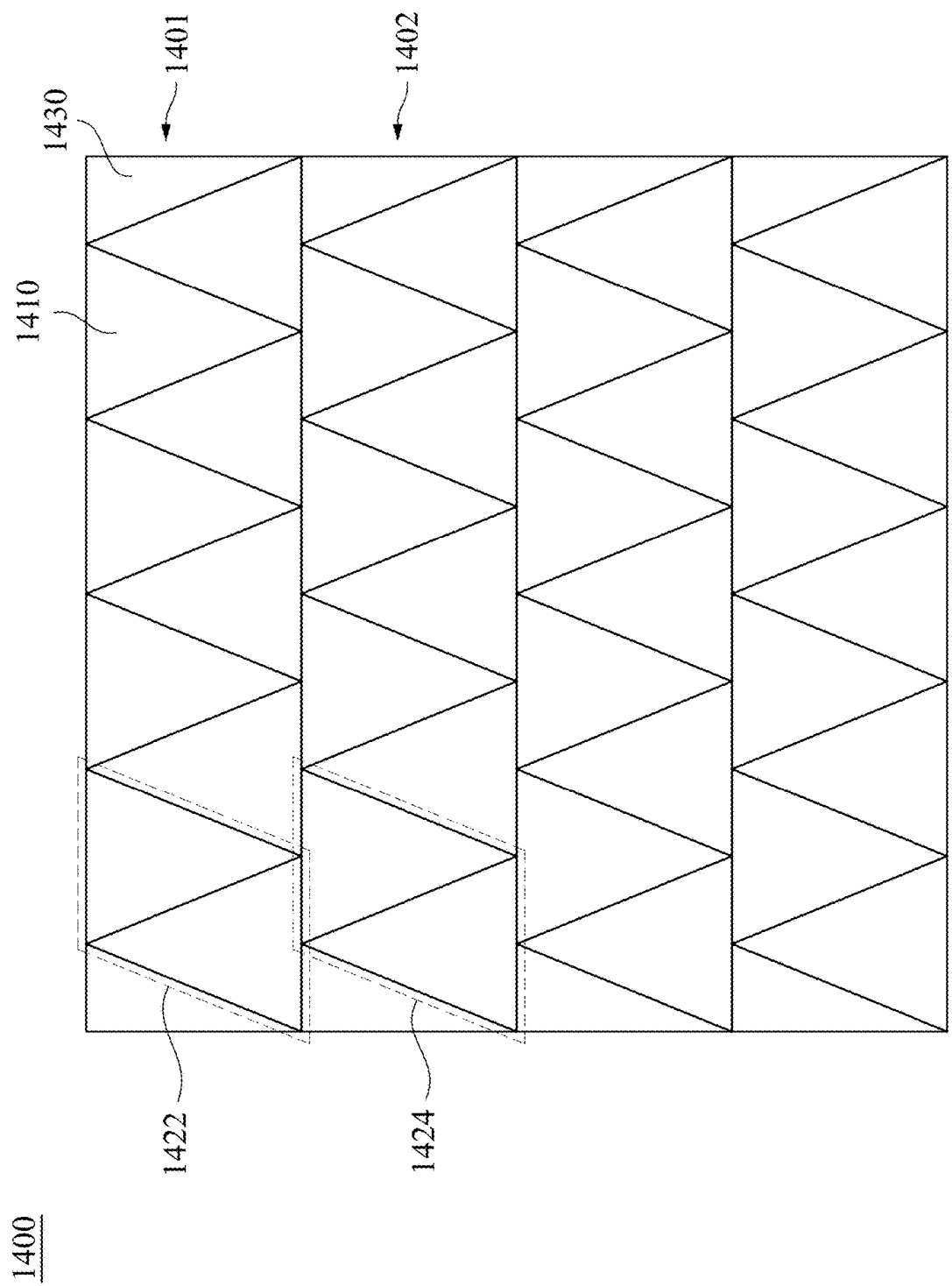

FIG. 14 illustrates a mesh pattern 1400 that can tile a surface of a RF screen with a plurality of individual openings 1410 each of which is in the shape of an isosceles triangle. The tiling by the mesh pattern 1400 is similar to the tiling by the mesh pattern 1300 in FIG. 13, except that the periodic cells in two adjacent rows are not aligned to each other in FIG. 14. For example, the mesh pattern 1400 includes a first row 1401 formed by periodic parallelograms; and includes a second row 1402 formed by periodic parallelograms. The first row 1401 and the second row 1402 are adjacent to each other. The periodic parallelogram 1422 of the first row 1401 and the periodic parallelogram 1424 of the second row 1402 are not aligned to each other, which means they are not sharing a common side. When the RF screen surface is in the shape of a rectangle as shown in FIG. 14, each row has two right triangles 1430 at the two ends of the row.

Figure 15:
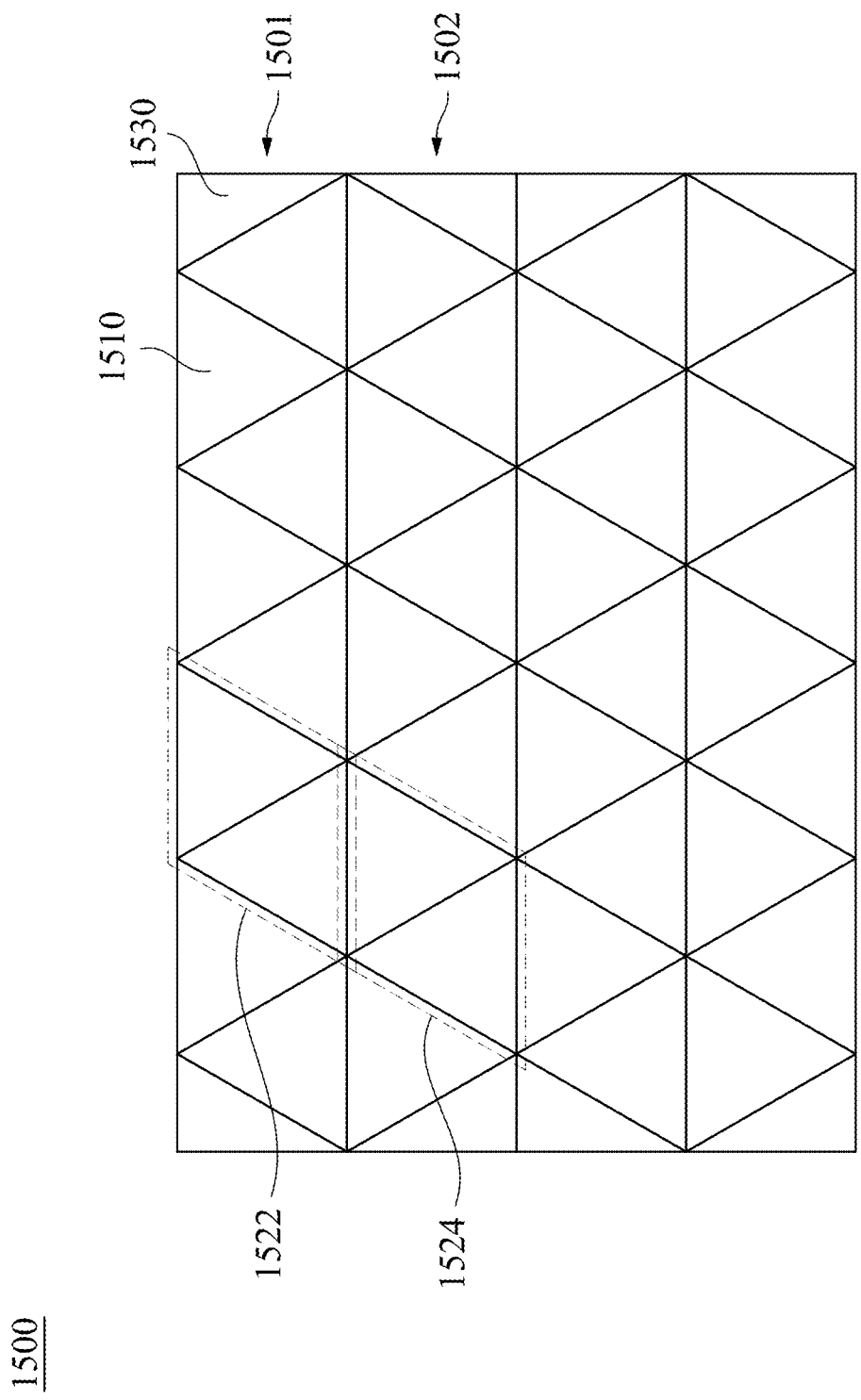
FIGS. 15-16 illustrate exemplary mesh patterns of RF screen openings in the shape of equilateral triangles, in accordance with some embodiments of the present disclosure.

FIG. 15 illustrates a mesh pattern 1500 that can tile a surface of a RF screen with a plurality of individual openings 1510 each of which is in the shape of an equilateral triangle. The tiling by the mesh pattern 1500 is similar to the tiling by the mesh pattern 1300 in FIG. 13, except that the repeating pattern 1522 in FIG. 15 is a diamond including two equilateral triangles that are side by side via a shared side, which is a diagonal line of the diamond. The periodic cells in two adjacent rows are aligned to each other in FIG. 15. For example, the periodic diamond 1522 of the first row 1501 and the periodic diamond 1524 of the second row 1502 are aligned to each other, which means they are side by side via a shared common side. When the RF screen surface is in the shape of a rectangle as shown in FIG. 15, each row has two right triangles 1530 at the two ends of the row.

Figure 16:
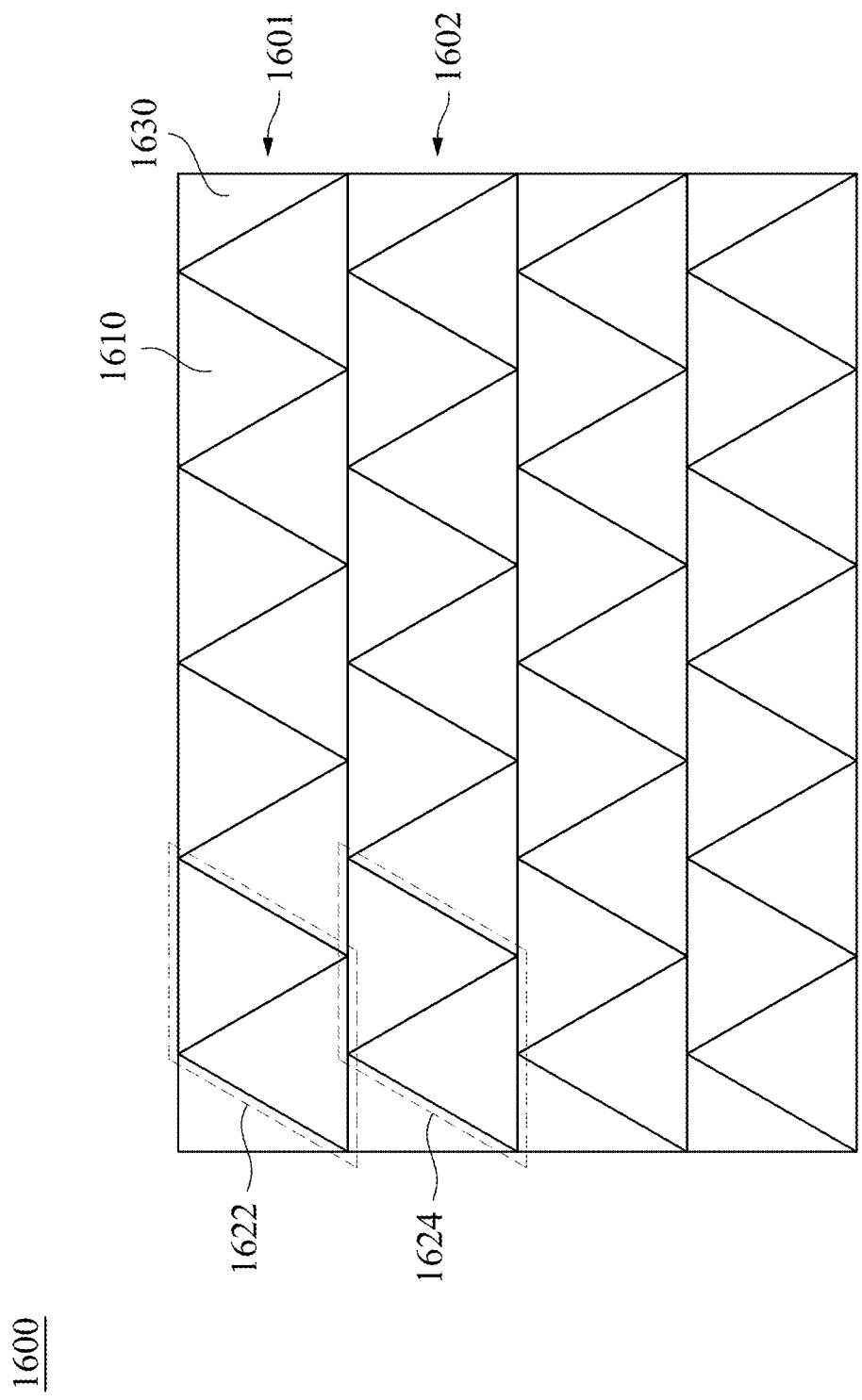
Figure 17:
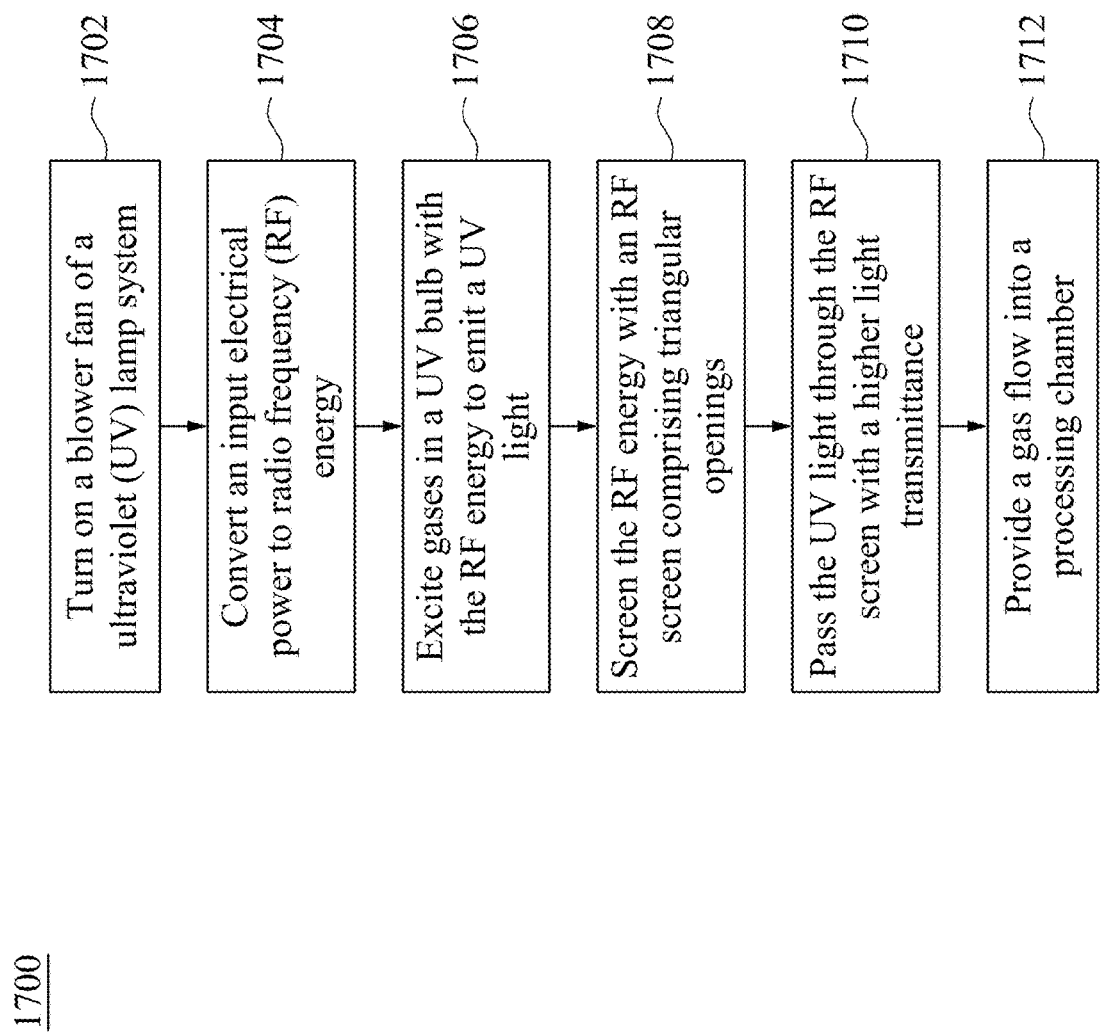
FIG. 17 illustrates a flow chart of a method for performing a UV induced deposition, in accordance with some embodiments of the present disclosure.

FIG. 16 illustrates a mesh pattern 1600 that can tile a surface of a RF screen with a plurality of individual openings 1610 each of which is in the shape of an equilateral triangle. The tiling by the mesh pattern 1600 is similar to the tiling by the mesh pattern 1500 in FIG. 15, except that the periodic cells in two adjacent rows are not aligned to each other in FIG. 16. For example, the periodic diamond 1622 of the first row 1601 and the periodic diamond 1624 of the second row 1602 are not aligned to each other, which means they are not sharing a common side. When the RF screen surface is in the shape of a rectangle as shown in FIG. 16, each row has two right triangles 1630 at the two ends of the row FIG. 17 illustrates a flow chart of a method 1700 for performing a UV induced deposition, in accordance with some embodiments of the present disclosure. The method begins at operation 1702, where a blower fan of a UV lamp system is turned on. At operation 1704, an input electrical power is converted to RF energy. At operation 1706, gases in a UV bulb is excited with the RF energy to emit a UV light. The RF energy is screened with an RF screen comprising triangular openings at operation 1708. Then at operation 1710, the UV light is passed through the RF screen with a higher light transmittance, compared to RF screens with rectangular or hexagonal openings. In one embodiment, the UV light passes through the RF screen with a light transmittance greater than 70%. In another embodiment, the UV light passes through the RF screen with a light transmittance greater than 75%. At operation 1712, a gas flow is provided into a processing chamber for UV induced deposition. The order of the operations in FIG. 17 may be changed according to various embodiments of the present teaching.

In some embodiments, a radio frequency (RF) screen for a microwave powered ultraviolet (UV) lamp system is disclosed. The RF screen includes: a sheet comprising a conductive material; and a frame around edges of the sheet. The conductive material defines a predetermined mesh pattern of individual openings across substantially an operative area of the screen. Each of the individual openings has a triangular shape. The predetermined mesh pattern comprises 16 to 36 individual openings per unit area of 1 square centimeter.

In some embodiments, a microwave powered ultraviolet (UV) lamp system is disclosed. The microwave powered UV lamp system includes: at least one magnetron configured to convert electrical power received from a power supply to radio frequency (RF) energy; a UV bulb configured to be excited by the RF energy to emit UV light; and an RF screen. The RF screen includes a sheet comprising a conductive material. The conductive material defines a predetermined mesh pattern of individual openings across. At least one of the individual openings has a triangular shape.

In some embodiments, a method is disclosed. The method includes: converting an input electrical power to radio frequency (RF) energy; exciting a ultraviolet (UV) bulb with the RF energy to emit a UV light; and screening the RF energy with an RF screen comprising a sheet having a predetermined mesh pattern of individual openings. At least one of the individual openings has a triangular shape.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according to embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A radio frequency (RF) screen, comprising:
a sheet comprising a conductive material,
wherein the conductive material defines a predetermined mesh pattern of individual openings across substantially an operative area of the RF screen,
wherein the predetermined mesh pattern comprises a plurality of rows each of which is formed by periodic cells comprising at least one triangle.

2. The RF screen of claim 1, wherein each of the individual openings is in a shape of an isosceles triangle.

3. The RF screen of claim 2, wherein the predetermined mesh pattern tiles a surface of the sheet with periodic parallelograms each of which is formed by a plurality of isosceles triangles.

4. The RF screen of claim 1, wherein each of the individual openings is in a shape of an equilateral triangle.

5. The RF screen of claim 1, wherein each of the individual openings is in a shape of a right triangle.

6. The RF screen of claim 5, wherein the predetermined mesh pattern tiles a surface of the sheet with periodic rectangles each of which is formed by a quantity of right triangles.

7. The RF screen of claim 6, wherein the quantity is: 2, 4 or 8.

8. The RF screen of claim 1, wherein the periodic cells in at least two adjacent rows are not aligned to each other.

9. The RF screen of claim 1, wherein:
the individual openings have shapes of multiple types of triangles; and
the multiple types of triangles comprise at least one of: an isosceles triangle, a right triangle, an equilateral triangle, or a scalene triangle.

10. The RF screen of claim 1, wherein the sheet has a thickness between 0.001 inch and 0.015 inch.

11. A microwave powered ultraviolet (UV) lamp system, comprising:
at least one magnetron configured to convert electrical power received from a power supply to radio frequency (RF) energy;
a UV bulb configured to be excited by the RF energy to emit UV light; and
an RF screen, wherein the RF screen comprises:
a sheet comprising a conductive material,
wherein the conductive material defines a predetermined mesh pattern of individual openings across an operative area of the sheet,
wherein the predetermined mesh pattern comprises a plurality of rows each of which is formed by periodic cells comprising at least one triangle.

12. The microwave powered UV lamp system of claim 11, wherein at least one of the individual openings has a rectangular shape.

13. The microwave powered UV lamp system of claim 11, wherein:
the sheet has a rectangular surface with four edges; and
the predetermined mesh pattern tiles the rectangular surface of the sheet with a plurality of triangles in proximity of the four edges and a plurality of rectangles surrounded by the plurality of triangles.

14. The microwave powered UV lamp system of claim 11, wherein:
the RF screen is configured to yield an increase in UV light transmittance compared to a reference screen with a mesh pattern comprising individual openings each of which is in a shape of: a square, a rectangle, or a hexagon; and
the RF screen and the reference screen have a same number of individual openings in a unit area.

15. The microwave powered UV lamp system of claim 11, wherein:
the RF screen is configured to yield a decrease in maximum deformation compared to a reference screen with a mesh pattern comprising individual openings each of which is in a shape of: a square, a rectangle, or a hexagon; and
the RF screen and the reference screen have a same number of individual openings in a unit area.

16. The microwave powered UV lamp system of claim 11, wherein:
the RF screen is configured to yield a decrease in maximum stress compared to a reference screen with a mesh pattern comprising individual openings each of which is in a shape of: a square, a rectangle, or a hexagon; and the RF screen and the reference screen have a same number of individual openings in a unit area.

17. The microwave powered UV lamp system of claim 11, wherein the conductive material comprises copper, brass, stainless steel, tungsten, aluminum, nickel, silver, or combinations thereof.

18. A method, comprising:
converting an input electrical power to radio frequency (RF) energy;
exciting a ultraviolet (UV) bulb with the RF energy to emit a UV light; and
screening the RF energy with an RF screen comprising a sheet having a predetermined mesh pattern of individual openings, wherein the predetermined mesh pattern comprises a plurality of rows each of which is formed by periodic cells comprising at least one triangle.

19. The method of claim 18, further comprising passing the UV light through the RF screen with a light transmittance greater than 70%.

20. The method of claim 19, wherein the UV light has a transmittance greater than 75%.

* * * * *